United States Patent

Fukushima et al.

[11] Patent Number: 5,858,481
[45] Date of Patent: Jan. 12, 1999

[54] ELECTRONIC CIRCUIT SUBSTRATE

[75] Inventors: Tetsuo Fukushima, Katano; Koichi Yoshida, Higashiosaka; Kenichiro Suetsugu, Nishinomiya, all of Japan

[73] Assignee: Matsushita Electric Industrial Co., Ltd., Osaka, Japan

[21] Appl. No.: 791,132

[22] Filed: Jan. 30, 1997

[30] Foreign Application Priority Data

Jan. 30, 1996 [JP] Japan .................................. 8-013966

[51] Int. Cl.⁶ .......................... C09K 19/00; H01L 23/28
[52] U.S. Cl. .......................... 428/1; 264/272.15; 428/68; 428/70; 428/76; 428/323; 428/324; 428/325; 428/329; 524/262; 525/444
[58] Field of Search .................. 428/1, 68, 76, 428/70, 323, 324, 325, 329; 264/272.15; 524/262; 525/444

[56] References Cited

U.S. PATENT DOCUMENTS

| | | | |
|---|---|---|---|
| 4,453,903 | 6/1984 | Pukaite | 425/117 |
| 5,070,127 | 12/1991 | Auerbach | 524/262 |
| 5,352,746 | 10/1994 | Asai | 525/444 |

FOREIGN PATENT DOCUMENTS

| | | |
|---|---|---|
| 340492 | 11/1989 | European Pat. Off. . |
| 62-108557 | 5/1987 | Japan . |
| 2145642 | 6/1990 | Japan . |
| 3096202 | 4/1991 | Japan . |
| 4233750 | 8/1992 | Japan . |
| 8008354 | 1/1996 | Japan . |

*Primary Examiner*—Nasser Ahmad
*Attorney, Agent, or Firm*—Price Gess & Ubell

[57] ABSTRACT

An electronic circuit substrate is sealed with a sealing material made of thermoplastic resin having a thermal-expansion coefficient close to that of a ceramic substrate by a compound filler dispersedly mixed in the sealing material. The filler includes at least two of milled fiber, glass fiber, and flaked filler.

12 Claims, 2 Drawing Sheets

ELECTRONIC CIRCUIT SUBSTRATE

BACKGROUND OF THE INVENTION

1. Technical Field of the Invention

The present invention relates to an electronic circuit substrate sealed by resin.

2. Description of Related Art

An electronic circuit substrate incorporated in a device used in an outdoor environment is usually sealed with resin or the like as it is often exposed to a severe condition under an extremely high or low temperature and/or with high humidity. The substrate is usually sealed by a conventional method requiring a long time, wherein the resin is provided to the substrate under a state of liquid for coating the whole surface or the surface of a specific component of the substrate and solidified. The sealing resin thereby enables a use of the substrate under a severe external condition.

FIG. 2 is a sectional view of a circuit substrate sealed with a thermosetting resin by a conventional method. The reference numeral 1 designates a ceramic substrate, 2 represents a mounted package component, 3 represents a mounted chip component, and 4 represents a phenol resin used for sealing. In this method, the substrate 1 mounted with the components 2, 3 is dipped into the liquid phenol resin 4, and heated to solidify the resin 4.

FIG. 3 is a sectional view of a substrate sealed by injection moulding using a conventional thermoplastic resin. The reference numeral 5 designates a ceramic substrate, 6 represents a mounted package component, 7 represents a mounted chip component, and 8 represents a thermoplastic resin used for sealing. In this method, the substrate 5 mounted with the components 6, 7 is set inside a metal mould of an injection moulding device, and the thermoplastic resin 8 is injected thereto and then solidified.

However, in the above described first conventional method wherein a substrate is dipped into and coated with a phenol resin, it requires much time to thermally set the liquid resin. Also, the coating film of the resin sealing the substrate cannot be fully evened, which often hinders an automatic assembly line by a robot.

On the other hand, the second conventional method described above, wherein a thermoplastic resin is injected by an injection moulding device and solidified, requires less time for setting by application of thermoplastic resin. This method also facilitates introduction of an automatic assembly system due to more precise dimensions of the sealing resin formed by a metal mould. Since an engineering plastic has a high sealing effect, it is often used as a thermoplastic resin in this method.

However, there is a great difference in the rate of thermal expansion (linear expansion coefficient) between the engineering plastic and the ceramic substrate. Under a certain condition such as a heat cycle test or the like, the shrinking resin sometimes causes cracks on the ceramic substrate, leading to a decrease in productivity of the electronic circuit substrate. The heat cycle test is, for example, carried out within the range from −40° C. to +150° C. depending on each case.

BRIEF SUMMARY OF THE INVENTION

In view of the foregoing, it is a primary object of the present invention to overcome the above described conventional problems and to provide a ceramic substrate sealed with a thermoplastic engineering plastic with a high sealing effect which can be produced efficiently at a stable rate.

In order to accomplish the above said object, an electronic circuit substrate of the present invention is sealed with a thermoplastic resin, the thermal-expansion coefficient of which is made to be close to that of a substrate made of ceramic by mixing a compound filler in the thermoplastic resin. The compound filler in the resin includes preferably at least two of milled fiber, glass fiber, and flaked filler, and the amount of the compound filler in the resin is 50% and below in weight with respect to the resin. Further, the thermoplastic resin consists preferably of liquid crystal polymer or of polyphenylenesulphide.

According to the present invention, the thermal-expansion coefficient of a thermoplastic resin used as a sealing material can be decreased to come nearer to the thermal expansion coefficient of a ceramic substrate by mixing fillers dispersedly in the resin. In respect of a liquid crystal polymer having very different coefficients of thermal expansion in a stream direction and in a perpendicular direction, the difference can be considerably reduced by compounding fillers in the resin. The substrate is thus not stressed despite changes in ambient temperature, and cracks can be prevented.

By preventing cracks on the substrate after the sealing operation or under a heat cycle test, a high yield of the substrate can be achieved. Also, the electronic circuit substrate of the present invention allows for a stable use owing to the prevention of cracks.

DETAILED DESCRIPTION OF THE INVENTION

Figure 1:
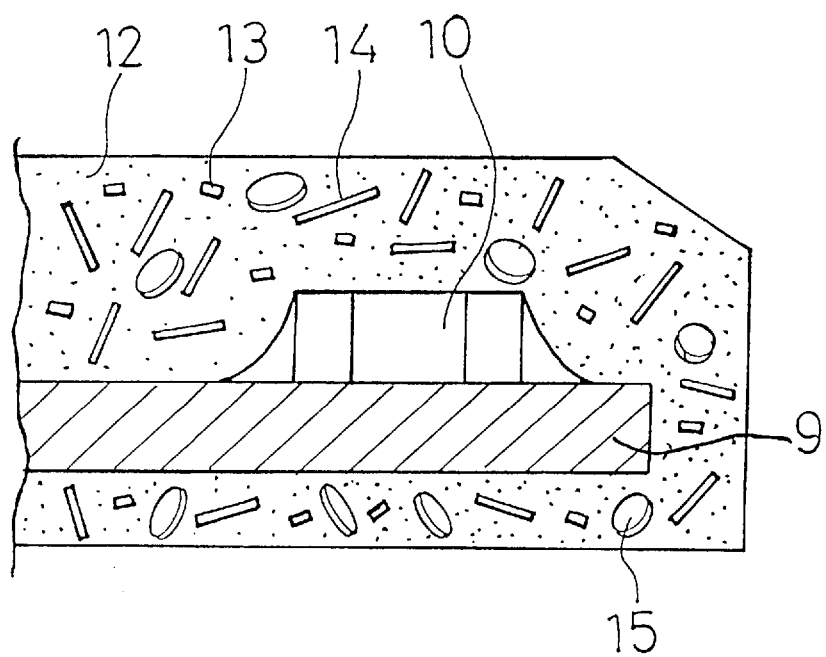
FIG. 1 is a typified sketch of an electronic circuit substrate according to an embodiment of the present invention.
Figure 2:
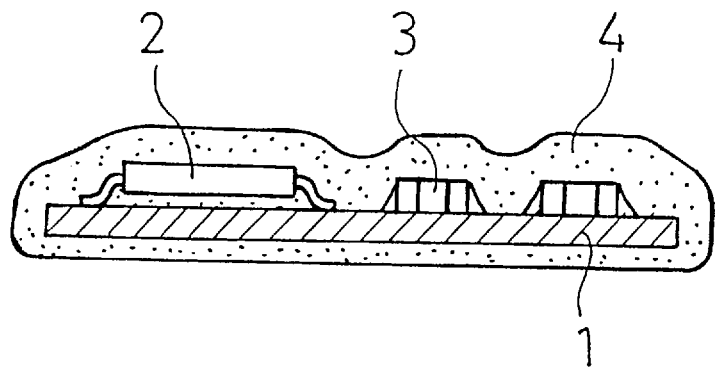
FIG. 2 is a sectional view of an electronic circuit substrate sealed in a conventional method.
Figure 3:
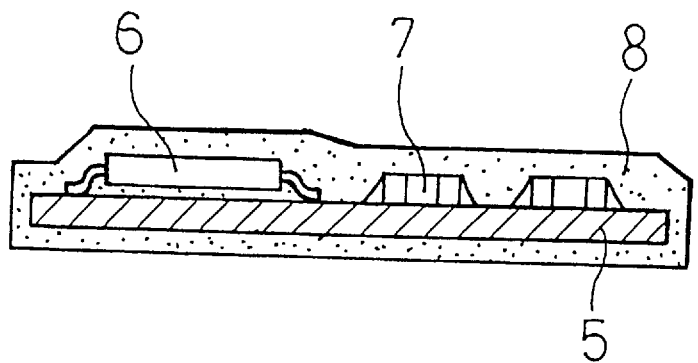
FIG. 3 is a sectional view of an electronic circuit substrate sealed in another conventional method.

Preferred embodiments of the present invention will be hereinafter described. FIG. 1 is a typified sketch of an electronic circuit substrate according to an embodiment of the present invention. The reference numeral 9 designates a ceramic substrate, on which a chip component 10 and a package component (not shown) are mounted. The numeral 12 represents a thermoplastic resin for sealing, and milled glass fiber 13, glass fiber 14, and flaked filler 15 are dispersedly added to the resin 12. Milled fiber 13 is made from longer glass fiber by cutting into pieces of medium length. The plasticity of the thermoplastic resin 12 is enhanced by adding this shorter milled fiber 13 compared with the resin with only the long glass fiber 14. The flaked filler 15 is made by forming metal oxide or the like into flakes.

As the compound filler to be added in the resin 12, any combinations of the two out of the above mentioned three fillers will effect similarly. That is to say, only the milled fiber 13 and the glass fiber 14 can be added as well as only the glass fiber 14 and the flaked filler 15 or the flaked filler 15 and the milled fiber 13. The gross weight of the compound filler should be 50% and below with respect to the thermoplastic resin 12 from the standpoint of plasticity, and should be 20% and over with respect to the thermoplastic resin 12, from the standpoint of thermal-expansion coefficient.

Liquid crystal polymer is most preferably used as the thermoplastic resin 12. Liquid crystal polymer is suitable for sealing as it has high heat resistance (more than 300° C. of melting point), a low thermal-expansion coefficient, and a low forming contraction coefficient. As the liquid crystal polymer, an aromatic liquid crystal polyester may be exemplarily used.

Polyphenylenesulphide may be second most suitable as the thermoplastic resin 12, since it has various characteristics similar to those of liquid crystal polymer which are considered to be necessary as a proper sealing material.

Example

The sealing material was composed of aromatic liquid crystal polyester as a thermoplastic resin and of a compound filler dispersedly mixed therein. The filler consisted of glass fiber, milled fiber, and flaked filler. The milled fiber was made from glass fiber cut into pieces by a milling of length from one fifth to one tenth with respect to raw fiber. As the flaked filler, metallic oxide such as zinc oxide or the like was employed.

The milled fiber, the glass fiber and the flaked filler were mixed at the rates of 15%, 20% and 5% in weight, respectively, in relation to the whole amount of the liquid crystal polymer.

The thermal-expansion coefficient of the sealing material composed as described above was $0.9 \times 10^{-5}/°C$., which is quite close to the thermal-expansion coefficient $0.7 \times 10^{-5}/°C$. of a ceramic substrate generally used.

An electronic circuit substrate comprising the ceramic substrate was set in a metal mould of an injection moulding device. The above described sealing material was then injected thereinto and solidified, sealing the whole surface of the electronic circuit substrate as shown in FIG. 1.

Owing to the low forming contraction coefficient of the sealing material, cracks could be hardly found on the substrate at the time of injection moulding, any more than under the heat cycle test within the range from −40° C. to +80° C. No defects could be detected in the characteristics of the electronic circuit substrate, and the whole yield achieved was over 98%.

As described above, the thermal-expansion coefficient of the sealing material can be made close to that of the ceramic substrate by mixing the compound filler in the sealing material. The electronic circuit substrate of the present invention is thus stress resistant and does not crack despite changes in external temperature. Since the substrate is sealed by injection moulding using a metal mould, the time required for processing is reduced, and an automatic assembly system can be introduced owing to the precise dimensions of the sealed substrate.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

We claim:

1. An electronic substrate comprising:
   a substrate made of ceramic and supporting one or more electronic components;
   a thermoplastic resin attached to the substrate for sealing a surface of the electronic circuit substrate and the electronic component; the thermoplastic resin having a thermal-expansion coefficient approximating a thermal-expansion coefficient of the substrate made of ceramic; and
   a compound filler mixed in the thermoplastic resin, said compound filler is present in an amount of 20–50 percent with respect to the weight of said thermoplastic resin and including a flaked metal oxide and a glass fiber of at least 20% by weight of the thermoplastic resin to provide the thermal-expansion coefficient.

2. An electronic circuit substrate according to claim 1, wherein the thermoplastic resin is liquid crystal polymer.

3. An electronic circuit substrate according to claim 1, wherein the thermoplastic resin is polyphenylenesulphide.

4. The invention of claim 2, wherein the compound filler further includes a glass milled fiber, the weight of the glass milled fiber is 15%, the weight of the glass fiber is 20%, and the weight of the flaked metal oxide is 5% relative to a total weight of the liquid crystal polymer to provide a thermal-expansion coefficient of approximately $0.9 \times 10^{-5}/°C$.

5. The invention of claim 4, wherein the flaked metal oxide is zinc oxide.

6. The invention of claim 4, wherein the compound filler consists of the flaked metal oxide and the glass fiber.

7. In an electronic circuit substrate made of ceramic and sealed with a resin, the improvement comprising:
   a sealing compound of a liquid crystal polymer and a filler mixture in an amount of 20 to 50 weight percent with respect to a weight of the liquid crystal polymer, the filler mixture including a milled glass fiber, a glass fiber, and a flaked filler, the sealing compound having a thermal-expansion coefficient close to a thermal-expansion coefficient of the ceramic substrate.

8. The invention of claim 7, wherein the thermal-expansion coefficient is approximately $0.9 \times 10^{-5}/°C$.

9. The invention of claim 8, wherein the flaked filler is zinc oxide.

10. The invention of claim 8, wherein the filler mixture consists of the milled glass fiber, the glass fiber, and the flaked filler.

11. The invention of claim 10, wherein the flaked filler is zinc oxide.

12. The invention of claim 10, wherein the weight of the glass milled fiber is 15%, the glass fiber is 20%, and the flaked filler is 5%, relative to the weight of the liquid crystal polymer.

* * * * *